United States Patent
Shin et al.

(10) Patent No.: US 10,497,691 B2
(45) Date of Patent: Dec. 3, 2019

(54) METHODS OF STACKING SEMICONDUCTOR DIES

(71) Applicant: SK hynix Inc., Incheon-si Gyeonggi-do (KR)

(72) Inventors: Chanho Shin, Icheon-si (KR); Seunghwan Kim, Icheon-si (KR); Pil Soon Bae, Icheon-si (KR); Hwijo Jeong, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/186,344

(22) Filed: Nov. 9, 2018

(65) Prior Publication Data

US 2019/0333910 A1    Oct. 31, 2019

(30) Foreign Application Priority Data

Apr. 30, 2018    (KR) .................. 10-2018-0050265

(51) Int. Cl.
*H01L 25/065* (2006.01)
*H01L 25/00* (2006.01)
*H01L 23/00* (2006.01)

(52) U.S. Cl.
CPC .............. *H01L 25/50* (2013.01); *H01L 24/05* (2013.01); *H01L 24/06* (2013.01); *H01L 24/13* (2013.01); *H01L 24/16* (2013.01); *H01L 24/17* (2013.01); *H01L 24/32* (2013.01); *H01L 24/33* (2013.01); *H01L 24/73* (2013.01); *H01L 24/81* (2013.01); *H01L 24/83* (2013.01); *H01L 24/92* (2013.01); *H01L 25/0652* (2013.01); *H01L 25/0657* (2013.01); *H01L 2224/0557* (2013.01); *H01L 2224/05547* (2013.01); *H01L 2224/05647* (2013.01); *H01L 2224/13111* (2013.01); *H01L 2224/16148* (2013.01); *H01L 2224/16238* (2013.01); *H01L 2224/17181* (2013.01); *H01L 2224/32145* (2013.01); *H01L 2224/32225* (2013.01); *H01L 2224/33181* (2013.01); *H01L 2224/73104* (2013.01); *H01L 2224/73204* (2013.01); *H01L 2224/81203* (2013.01); *H01L 2224/83203* (2013.01); *H01L 2224/9211* (2013.01); *H01L 2225/06513* (2013.01); *H01L 2225/06517* (2013.01); *H01L 2225/06541* (2013.01); *H01L 2225/06548* (2013.01);

(Continued)

(58) Field of Classification Search
CPC ......... H01L 25/50; H01L 24/05; H01L 24/06; H01L 24/73; H01L 25/0652; H01L 25/0657
USPC ............................................... 438/109
See application file for complete search history.

(56) References Cited

U.S. PATENT DOCUMENTS 9,570,421 B2    2/2017  Wu et al.
2009/0267238 A1*  10/2009  Joseph .............. H01L 23/49833
                                        257/777

(Continued)

*Primary Examiner* — Sheikh Maruf
(74) *Attorney, Agent, or Firm* — William Park & Associates Ltd.

(57) ABSTRACT

A method of stacking semiconductor dies includes attaching a lower semiconductor die to a base substrate with an adhesive layer and attaching an upper semiconductor die to the lower semiconductor die with another adhesive layer. A thermo-compression bonding technique is applied to the upper semiconductor die to cure the adhesive layers and to bond the upper semiconductor die to the lower semiconductor die.

20 Claims, 13 Drawing Sheets

(52) U.S. Cl.
   CPC ............ *H01L 2225/06565* (2013.01); *H01L 2225/06593* (2013.01)

(56) References Cited

U.S. PATENT DOCUMENTS

| | | | |
|---|---|---|---|
| 2011/0204505 A1* | 8/2011 | Pagaila | H01L 21/568 257/686 |
| 2011/0248396 A1* | 10/2011 | Liu | H01L 25/0657 257/686 |
| 2012/0074585 A1* | 3/2012 | Koo | H01L 21/486 257/774 |
| 2012/0181703 A1* | 7/2012 | Park | C09J 133/06 257/774 |
| 2013/0099235 A1* | 4/2013 | Han | H01L 22/14 257/48 |
| 2014/0159238 A1 | 6/2014 | Aldrete et al. | |
| 2015/0130072 A1* | 5/2015 | Wu | H01L 25/0657 257/774 |
| 2015/0279825 A1* | 10/2015 | Kang | H01L 25/50 257/48 |
| 2015/0348874 A1* | 12/2015 | Tsai | H01L 23/481 257/774 |
| 2016/0155665 A1* | 6/2016 | Kuang | H01L 24/06 438/109 |
| 2017/0040296 A1* | 2/2017 | Das | H01L 23/481 |
| 2017/0162507 A1* | 6/2017 | Das | H01L 21/486 |
| 2018/0102469 A1* | 4/2018 | Das | H01L 25/0652 |

\* cited by examiner

METHODS OF STACKING SEMICONDUCTOR DIES

CROSS-REFERENCE TO RELATED APPLICATIONS

The present application claims priority under 35 U.S.C. 119(a) to Korean Application No. 10-2018-0050265, filed on Apr. 30, 2018, which is incorporated herein by references in its entirety.

BACKGROUND

1. Technical Field

The present disclosure relates to semiconductor package technologies and, more particularly, to methods of stacking a plurality of semiconductor dies.

2. Related Art

Recently, semiconductor packages having a high bandwidth and a large storage capacity have been required in various electronic systems. In response to such a demand, effort has been focused on improving a technique for vertically stacking a plurality of semiconductor dies to increase the number of semiconductor dies embedded in one semiconductor package. A bonding technique may be used to vertically stack the plurality of semiconductor dies.

SUMMARY

According to an embodiment, a method of stacking semiconductor dies includes: providing a base substrate having a first bonding terminal disposed on a surface of the base substrate; providing a first lower semiconductor die having a second bonding terminal, a first through via, and a third bonding terminal; and providing an upper semiconductor die having a fourth bonding terminal, a second through via, and a fifth bonding terminal. The method further includes aligning the first lower semiconductor die with the base substrate such that the second bonding terminals in contact with the first bonding terminal and providing a first adhesive layer between the first lower semiconductor die and the base substrate. The method also includes aligning the upper semiconductor die with the first lower semiconductor die such that the fourth bonding terminal is in contact with the third bonding terminal and providing a second adhesive layer between the upper semiconductor die and the first lower semiconductor die. The method additionally includes performing a first thermo-compression bonding process to cure the first and second adhesive layers, form a first bonded structure from the first and second bonding terminals, and form a second bonded structure from the third and fourth bonding terminals.

According to another embodiment, a method of stacking semiconductor dies includes: providing a base substrate having a first bonding terminal disposed on a surface of the base substrate; providing a first lower semiconductor die having a second bonding terminal, a first through via, and a third bonding terminal; providing a first upper semiconductor die having a fourth bonding terminal, a second through via, and a fifth bonding terminal; providing a middle semiconductor die having a sixth bonding terminal, a third through via, and a seventh bonding terminal; and providing a second upper semiconductor die having an eighth bonding terminal, a fourth through via, and ninth bonding terminal. The method further includes aligning the first lower semiconductor die with the base substrate such that the second bonding terminal is in contact with the first bonding terminal and providing a first adhesive layer between the first lower semiconductor die and the base substrate. The method further includes aligning the first upper semiconductor die with the first lower semiconductor die such that the fourth bonding terminal is in contact with the third bonding terminal and providing a second adhesive layer between the first upper semiconductor die and the first lower semiconductor die. The method further includes performing a first thermo-compression bonding process to cure the first and second adhesive layers, form a first bonded structure from the first and second bonding terminals, and form a second bonded structure from the third and fourth bonding terminals. The method further includes aligning the middle semiconductor die with the first upper semiconductor die such that the sixth bonding terminal is in contact with the fifth bonding terminal and providing a third adhesive layer between the middle semiconductor die and the first upper semiconductor die. The method further includes aligning the second upper semiconductor die with the middle semiconductor die such that the eighth bonding terminal is in contact with the seventh bonding terminal and providing a fourth adhesive layer between the second upper semiconductor die and the middle semiconductor die. The method further includes performing a second thermo-compression bonding process to cure the third and fourth adhesive layers, form a third bonded structure from the fifth and sixth bonding terminals, and form a fourth bonded structure from the seventh and eighth bonding terminals.

According to another embodiment, a method of stacking semiconductor dies includes stacking at least one semiconductor die on a base substrate, wherein each of the at least one semiconductor dies includes a first set of bonding terminals on a first side of the semiconductor die, a second set of bonding terminals on a second side of the semiconductor die, and a set of through vias penetrating the semiconductor die with each through via connecting a bonding terminal on the first side of the semiconductor die to a bonding terminal on the second side of the semiconductor die. The method further includes aligning the at least one stacked semiconductor die over the base substrate in a first-side-down orientation so that the first set of bonding terminals of a lowermost semiconductor die of the aligned stacked at least one semiconductor die connect with a set of bonding terminals on a surface of the base substrate. The method also includes applying heat to the second set of bonding terminals of an uppermost semiconductor die of the aligned stacked at least one semiconductor die so that the applied heat is conducted through the sets of through vias of the aligned stacked at least one semiconductor die, wherein, as a result of the conducted heat, the first set of bonding terminals of the lowermost semiconductor die fuse with the set of bonding terminals of the base substrate to form a set of bonded structures between the lowermost semiconductor die and the base substrate.

DETAILED DESCRIPTION

Figure 1:
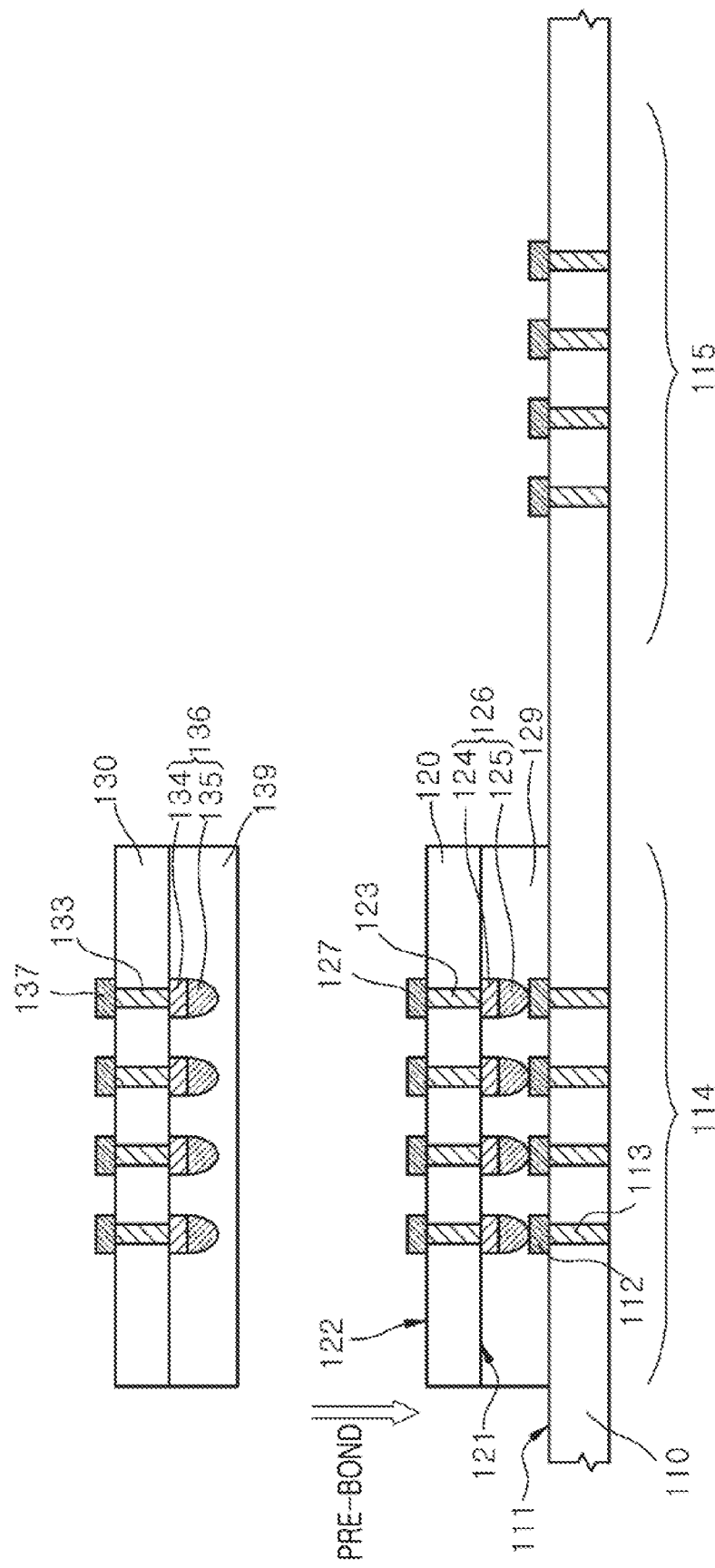
FIGS. 1 to 6 show cross-sectional views illustrating a method of stacking semiconductor dies, according to an embodiment.

The terms used herein may correspond to words selected in consideration of their functions in various embodiments, and the meanings of the terms may be construed to be different according to the level of ordinary skill in the art to which the embodiments belong. If terms are defined herein, the terms may be construed according to the provided definitions. Unless otherwise defined, terms (including technical and scientific terms) used herein have the same meaning as would be commonly understood by a person of ordinary skill in the art.

It will be understood that the terms "first," "second," "third," etc. are used herein to identify various elements. The elements should not be limited by these terms. These terms are used to distinguish one element from another element and not for indicating a number or order of the elements. For example, first and second dies, bonding terminals, bonded structures, through vias, and adhesive layers, does not indicate that such structures are limited to two in number or that the first is prioritized over the second.

It will also be understood that when an element or layer is referred to as being "on," "over," "below," "under," or "outside" another element or layer, the element or layer may be in direct contact with the other element or layer, or intervening elements or layers may be present. Other words used to describe the relationship between elements or layers should be interpreted in a like fashion (e.g., "between" versus "directly between" or "adjacent" versus "directly adjacent").

Spatially relative terms, such as "beneath," "below," "lower," "above," "upper," "top," "bottom" and the like, may be used to describe an element and/or a feature's relationship to another element(s) and/or feature(s) as, for example, illustrated in the figures. It will be understood that spatially relative terms are intended to encompass different orientations of the device in use and/or operation in addition to the orientation depicted in the figures. For example, when a device in the figures is turned over, elements described as below and/or beneath other elements or features would then be oriented above the other elements or features. When the device is otherwise oriented (e.g., rotated 90 degrees or at other orientations), the spatially relative descriptors used herein should be interpreted accordingly.

The word "set," as used herein, can include multiple elements or have only a single element. For example, a set of through vias for a semiconductor die can, for various embodiments, include multiple through vias or only a single through via. Similarly, at least one semiconductor die can include multiple semiconductor dies or have only a single semiconductor die. When a stack of at least one semiconductor die includes only a single semiconductor die, then the single semiconductor die represents both the uppermost and lowermost semiconductor die in the stack. Adjacent semiconductor dies in a stack indicate neighboring dies in the stack.

A semiconductor package may include electronic devices such as semiconductor chips or semiconductor dies. The semiconductor chips or the semiconductor dies may be obtained by separating a semiconductor substrate, such as a wafer, into a plurality of pieces using a die sawing process. The semiconductor chips may correspond to memory chips, logic chips (including application specific integrated circuits (ASIC) chips), or system-on-chips (SoC). The memory chips may include dynamic random access memory (DRAM) circuits, static random access memory (SRAM) circuits, NAND-type flash memory circuits, NOR-type flash memory circuits, magnetic random access memory (MRAM) circuits, resistive random access memory (ReRAM) circuits, ferroelectric random access memory (FeRAM) circuits or phase change random access memory (PcRAM) circuits which are integrated on the semiconductor substrate. The logic chips may include logic circuits which are integrated on the semiconductor substrate. The semiconductor package may be employed in communication systems such as mobile phones, electronic systems associated with biotechnology or health care, or wearable electronic systems.

The present disclosure is described in conjunction with a semiconductor package including a plurality of semiconductor dies which are vertically stacked. The plurality of semiconductor dies may be electrically connected to each other by through silicon via (TSV) structures. Each of the TSV structures means an interconnection structure including a through electrode such as the TSV vertically penetrating the semiconductor die. The plurality of semiconductor dies may be electrically connected to each other by interconnection structures including the TSVs and bumps. The bumps may be connection members connected to the TSVs.

The present disclosure may also relate to a high bandwidth memory (HBM) package. The HBM package may include an HBM interface to improve a data transmission speed between the HBM package and a processor chip. The HBM package may be realized using the TSV structure to increase the number of input/output (I/O) terminals. A processor chip supporting an operation of the HBM package may be an application specific integrated circuit (ASIC) chip including a central processing unit (CPU) or a graphics processing unit (GPU), a microprocessor or a microcontroller, an application processor (AP), a digital signal processing core, and an interface.

Same reference numerals refer to same elements throughout the specification. Even though a reference numeral is not mentioned or described with reference to a drawing, the reference numeral may be mentioned or described with reference to another drawing. In addition, even though a reference numeral is not shown in a drawing, it may be mentioned or described with reference to another drawing.

FIGS. 1 to 6 show cross-sectional views illustrating a method of stacking semiconductor dies according to an embodiment.

Referring to FIG. 1, a first lower semiconductor die 120 may be attached to a base substrate 110. A second lower semiconductor die 130 may be disposed over the first lower semiconductor die 120. The first and second lower semiconductor dies 120 and 130 may be referred to as lower semiconductor dies for the purpose of ease and convenience in explanation.

The base substrate 110 may have a wafer shape. The base substrate 110 may be a silicon wafer including integration circuits. In another embodiment, the base substrate 110 may be a package substrate or an interposer on which the lower semiconductor dies 120 and 130 are mounted.

The base substrate 110 may have a surface 111 on which the lower semiconductor dies 120 and 130 are stacked, and first bonding terminals 112 electrically connected to the first lower semiconductor die 120 may be disposed on the surface 111 of the base substrate 110. The first bonding terminals 112 disposed on the base substrate 110 may be conductive connection bumps. The base substrate 110 may include through vias 113 electrically connected to respective ones of the first bonding terminals 112. First ends of the through vias 113 may be connected to the first bonding terminals 112, respectively. The through vias 113 may penetrate the base substrate 110 to have a through silicon via (TSV) shape. The through vias 113 may referred to as third through vias in order to distinguish the through vias 113 from other through vias.

The base substrate 110 may include a first region 114 and a second region 115, which are spaced apart from each other. Each of the first and second regions 114 and 115 may include the first bonding terminals 112 and the through vias 113. The first lower semiconductor die 120 may be attached to the first region 114 of the base substrate 110.

The first lower semiconductor die 120 may include integrated circuits. The first lower semiconductor die 120 may have a first surface 121 facing the surface 111 of the base substrate 110 and a second surface 122 located opposite to the base substrate 110. The first lower semiconductor die 120 may include first through vias 123 substantially penetrating the first lower semiconductor die 120. The first through vias 123 may correspond to through silicon vias (TSVs) that substantially extend from the first surface 121 to the second surface 122 of the first lower semiconductor die 120. Second bonding terminals 126 may be connected to first ends of the first through vias 123, and third bonding terminals 127 may be connected to second ends of the first through vias 123 opposite to the second bonding terminals 126.

The second bonding terminals 126 may provide an interconnection structure for electrically connecting the first lower semiconductor die 120 to the base substrate 110. Each of the second bonding terminals 126 may include a first connection bump 124 connected to any one of the first through vias 123 and a first solder bump 125 covering an end of the first connection bump 124. The first connection bumps 124 of the second bonding terminals 126 may be metal bumps such as copper bumps. The first solder bumps 125 of the second bonding terminals 126 may include a tin-silver alloy material. A barrier layer such as a nickel (Ni) layer may be additionally disposed between the first connection bump 124 and the first solder bump 125. The third bonding terminals 127 may act as an interconnection structure for electrically connecting the first lower semiconductor die 120 to the second lower semiconductor die 130. The third bonding terminals 127 may be conductive connection bumps.

A first adhesive layer 129 may be provided on the first surface 121 of the first lower semiconductor die 120. The first adhesive layer 129 may cover the first surface 121 of the first lower semiconductor die 120 and may embed the second bonding terminals 126. The first adhesive layer 129 may be laminated on the first surface 121 of the first lower semiconductor die 120. The first adhesive layer 129 may include a nonconductive film (NCF).

The first lower semiconductor die 120 may be attached to the first region 114 of the base substrate 110 using a die attachment technique. The first lower semiconductor die 120 may be picked up using a die attachment tool and may be aligned with the first region 114 of the base substrate 110. As a result, the first lower semiconductor die 120 may be placed on the first region 114 of the base substrate 110. The first adhesive layer 129 may function as a medium material for attaching the first lower semiconductor die 120 to the surface 111 of the base substrate 110.

The first lower semiconductor die 120 may be attached to the base substrate 110 such that the second bonding terminals 126 of the first lower semiconductor die 120 are aligned with the first bonding terminals 112 of the base substrate 110. The first adhesive layer 129 may exist between the first lower semiconductor die 120 and the base substrate 110 in a non-cured state. In such a case, the second bonding terminals 126 of the first lower semiconductor die 120 may merely be in physical contact with the first bonding terminals 112 of the base substrate 110, respectively. That is, the second bonding terminals 126 of the first lower semiconductor die 120 might not be welded or mechanically bonded to the first bonding terminals 112 of the base substrate 110. Therefore, the first lower semiconductor die 120 may be incompletely or unstably bonded to the base substrate 110 with the first adhesive layer 129 which is not cured. Accordingly, the first lower semiconductor die 120 may be attached to the base substrate 110 in a pre-bonded state.

In order to obtain an electrically stable and reliable interconnection state between the first lower semiconductor die 120 and the base substrate 110, it may be necessary for an embodiment to perform a process operation for applying a thermo-compression bonding technique to the first and second bonding terminals 112 and 126. After the first lower semiconductor die 120 is attached to the base substrate 110, the second lower semiconductor die 130 may be attached to the first lower semiconductor die 120 in a pre-bonded state without performing the thermo-compression bonding process.

The second lower semiconductor die 130 may be substantially the same semiconductor die as the first lower semiconductor die 120. The second lower semiconductor die 130 may include fourth through vias 133 penetrating the second lower semiconductor die 130. The second lower semiconductor die 130 may further include seventh bonding terminals 136 connected to first ends of the fourth through vias 133 and eighth bonding terminals 137 connected to second ends of the fourth through vias 133. Each of the seventh bonding terminals 136 may include a second connection bump 134 and a second solder bump 135. A fourth adhesive layer 139 may be laminated on a surface of the second lower semiconductor die 130 opposite to the eighth bonding terminals 137 to cover the seventh bonding terminals 136.

Figure 2:
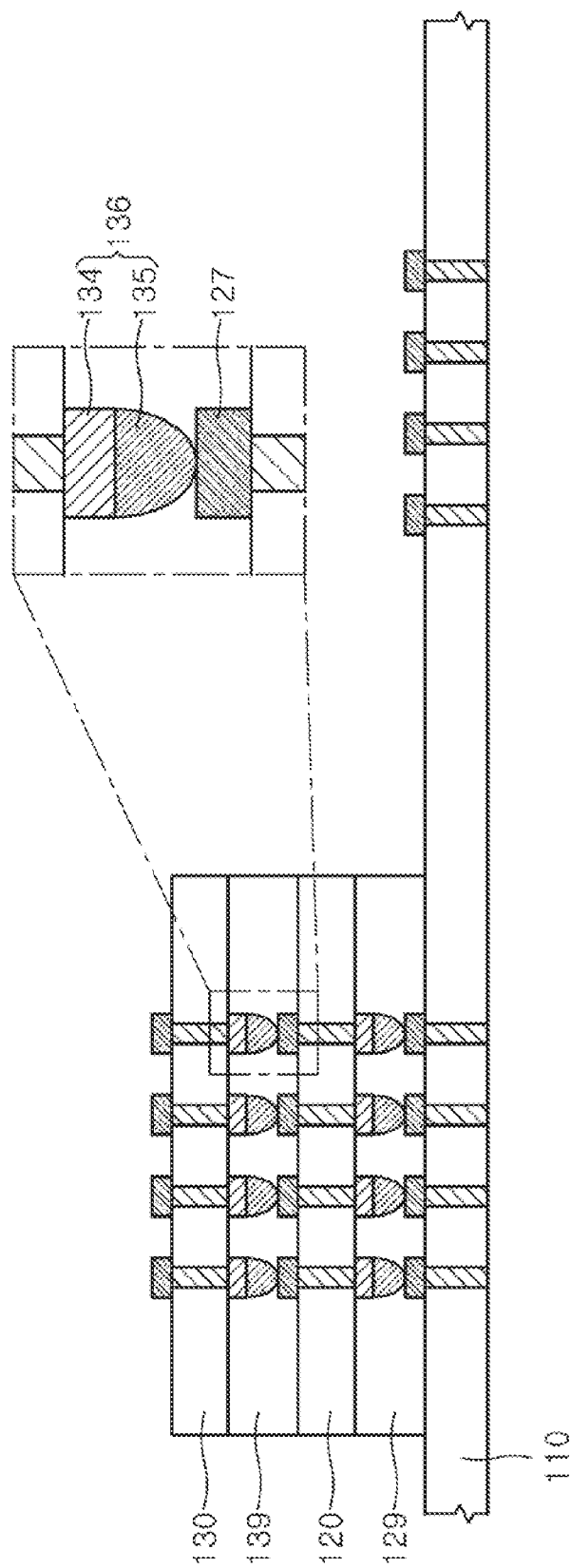

Referring to FIGS. 1 and 2, the second lower semiconductor die 130 may be attached to the first lower semiconductor die 120 using a die attachment technique. As illustrated in FIG. 1, the second lower semiconductor die 130 may be put over the first lower semiconductor die 120 and moved down to attach the second lower semiconductor die 130 to the first lower semiconductor die 120, as illustrated in FIG. 2. In such a case, the fourth adhesive layer 139 may function as a medium material for attaching the second lower semiconductor die 130 to the first lower semiconductor die 120.

Referring to FIG. 2, the fourth adhesive layer 139 may exist between the first lower semiconductor die 120 and the second lower semiconductor die 130 in a non-cured state. In such a case, the seventh bonding terminals 136 of the second lower semiconductor die 130 may be in physical contact with the third bonding terminals 127 of the first lower semiconductor die 120, respectively. That is, the second solder bumps 135 of the seventh bonding terminals 136 may contact surfaces of the third bonding terminals 127 of the first lower semiconductor die 120. Accordingly, the second lower semiconductor die 130 may be attached to the first lower semiconductor die 120 in a pre-bonded state.

Figure 3:
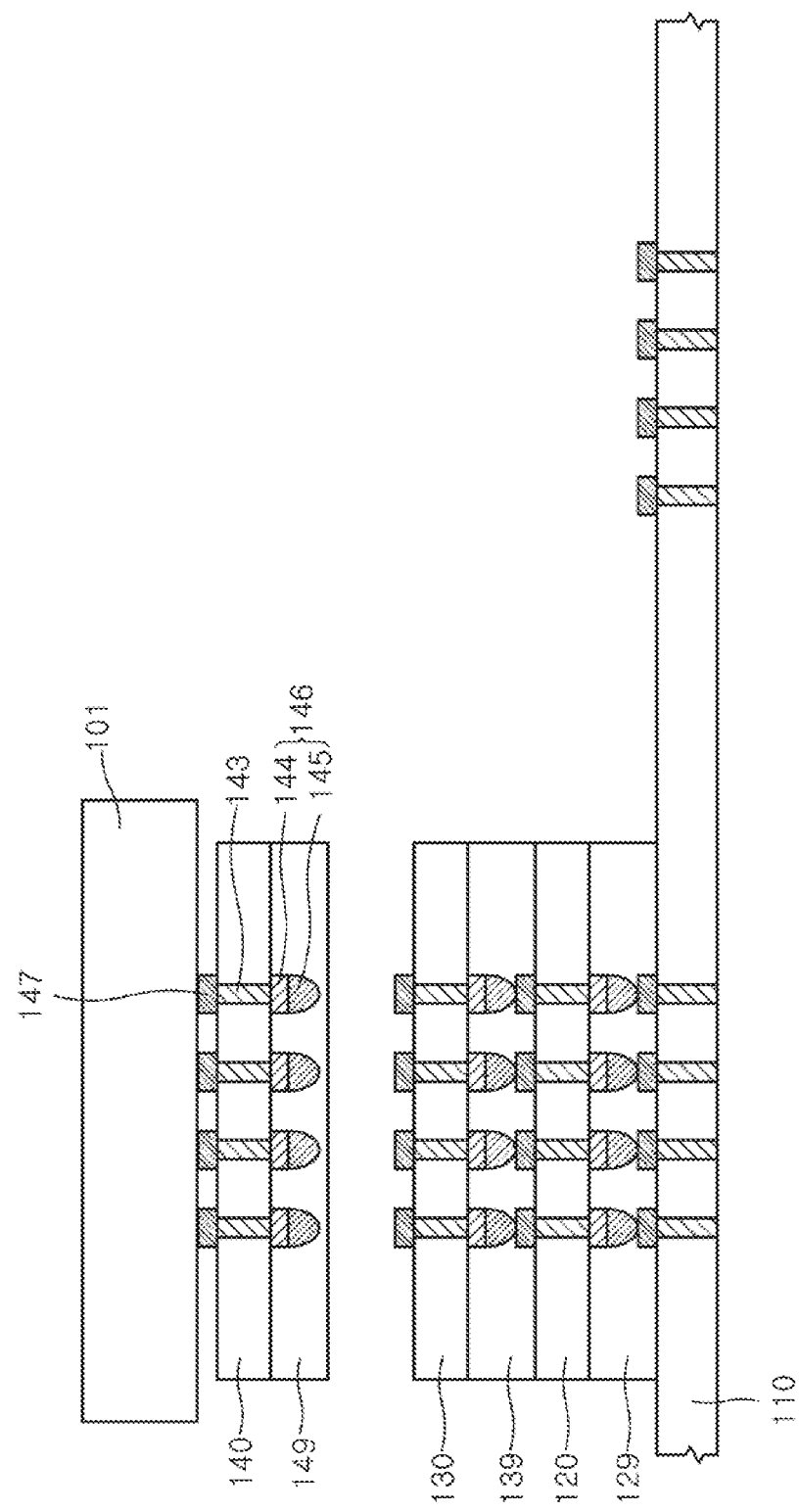

Referring to FIG. 3, an upper semiconductor die 140 may be provided over the lower semiconductor dies 120 and 130. The upper semiconductor die 140 may be substantially the same as the lower semiconductor dies 120 and 130. The upper semiconductor die 140 may include second through vias 143 substantially penetrating the upper semiconductor die 140. The upper semiconductor die 140 may further include fourth bonding terminals 146 connected to first ends of the second through vias 143 and fifth bonding terminals 147 connected to second ends of the second through vias 143. Each of the fourth bonding terminals 146 may include a third connection bump 144 and a third solder bump 145. A second adhesive layer 149 may be laminated on a surface of the upper semiconductor die 140 opposite to the fifth bonding terminals 147 to cover the fourth bonding terminals 146.

A thermo-compression bonding tool 101 of a thermo-compression bonding apparatus performing a thermo-compression bonding process may pick up the upper semiconductor die 140 and may put the upper semiconductor die 140 over the lower semiconductor dies 120 and 130 to align the upper semiconductor die 140 with the lower semiconductor dies 120 and 130. Since the thermo-compression bonding tool 101 includes a heater (not shown), the thermo-compression bonding tool 101 may heat the third solder bump 145 to a temperature which is equal to or higher than a melting point of the third solder bump 145.

Figure 4:
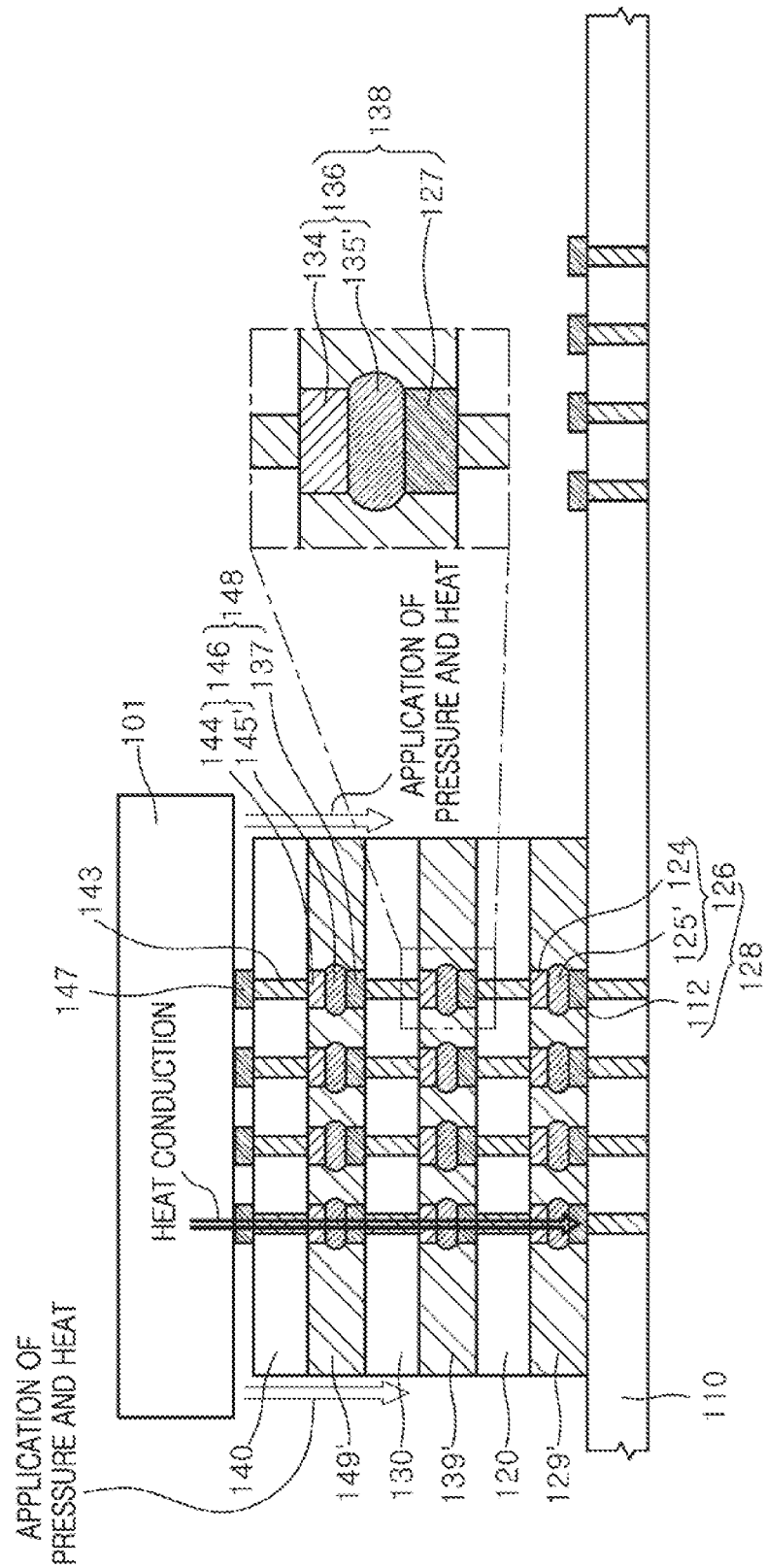

Referring to FIG. 4, a first thermo-compression bonding process may be performed using the thermo-compression bonding tool 101. Specifically, the thermo-compression bonding tool 101 holding the upper semiconductor die 140 may move down to put the upper semiconductor die 140 on the second lower semiconductor die 130 and may apply heat and pressure to the upper semiconductor die 140. The heat and pressure applied to the upper semiconductor die 140 may be conducted to the lower semiconductor dies 120 and 130, which are located under the upper semiconductor die 140.

Heat generated by the thermo-compression bonding tool 101 may be conducted to the eighth bonding terminals 137 of the second lower semiconductor die 130 through the fifth bonding terminals 147, the second through vias 143, and the fourth bonding terminals 146 of the upper semiconductor die 140. The heat conducted to the eighth bonding terminals 137 of the second lower semiconductor die 130 may be conducted to the third bonding terminals 127 of the first lower semiconductor die 120 through the fourth through vias 133 and the seventh bonding terminals 136 of the second lower semiconductor die 130. The heat conducted to the third bonding terminals 127 of the first lower semiconductor die 120 may be conducted to the first bonding terminals 112 of the base substrate 110 through the first through vias 123 and the second bonding terminals 126 of the first lower semiconductor die 120.

The heat generated by the thermo-compression bonding tool 101 may be conducted to the base substrate 110 located below the thermo-compression bonding tool 101 through the through vias 143, 133, and 123, which are aligned with each other. The heat and the pressure generated by the thermo-compression bonding tool 101 may cause first thermo-compression bonding between the base substrate 110 and the first lower semiconductor die 120, between the first lower semiconductor die 120 and the second lower semiconductor die 130, and between the second lower semiconductor die 130 and the upper semiconductor die 140. That is, the base substrate 110, the first lower semiconductor die 120, the second lower semiconductor die 130, and the upper semiconductor die 140 may be simultaneously bonded to each other by a thermo-compression bonding technique.

The second bonding terminals 126 and the first bonding terminals 112 may be bonded to each other by the first thermo-compression bonding process to provide a first bonded structure 128. The seventh bonding terminals 136 and the third bonding terminals 127 may be bonded to each other by the first thermo-compression bonding process to provide a second bonded structure 138. The fourth bonding terminals 146 and the eighth bonding terminals 137 may be bonded to each other by the first thermo-compression bonding process to provide a sixth bonded structure 148. The first to third solder bumps 125, 135, and 145 may be transformed due to the heat and pressure generated by the thermo-compression bonding tool 101 to provide first to third transformed solder bumps 125', 135', and 145' while the first thermo-compression bonding process is performed. The first transformed solder bumps 125' may bond the first connection bumps 124 to the first bonding terminals 112 to form the first bonded structure 128. For an embodiment, heat from the first thermo-compression bonding process melts the first solder bumps 125, which, upon the removal heat, solidify to conductively fuse the first connection bumps 124 to the first bonding terminals 112.

The base substrate 110, the first lower semiconductor die 120, the second lower semiconductor die 130, and the upper semiconductor die 140 may be physically and electrically connected to each other by the first to third bonded structures 128, 138, and 148, which are formed by the first thermo-compression bonding process.

Figure 5:
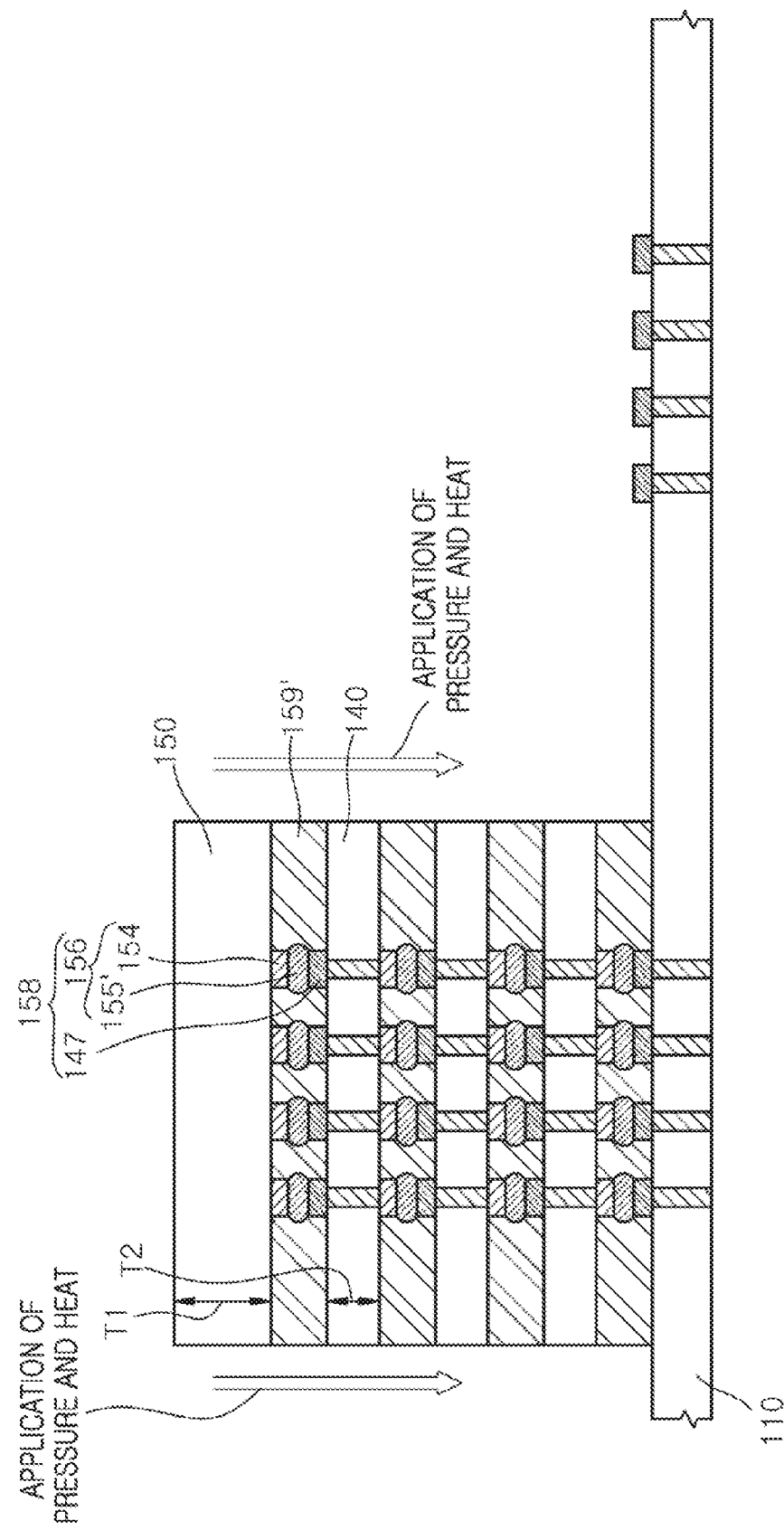

Referring to FIG. 5, an uppermost semiconductor die 150 may be bonded to the upper semiconductor die 140 using a second thermo-compression bonding process. The uppermost semiconductor die 150 may have sixth bonding terminals 156 facing the fifth bonding terminals 147 of the upper semiconductor die 140. The uppermost semiconductor die 150 may have a thickness T1. For some embodiments, the thickness T1 is greater than a thickness T2 of the upper semiconductor die 140. In further embodiments, no through vias are included in the uppermost semiconductor die 150.

The uppermost semiconductor die 150 may be stacked on and aligned with the upper semiconductor die 140 such that a third adhesive layer is disposed between the uppermost semiconductor die 150 and the upper semiconductor die 140. After the uppermost semiconductor die 150 is stacked on the upper semiconductor die 140, the second thermo-compression bonding process may be performed to cure the third adhesive layer. The third adhesive layer may be transformed by the second thermo-compression bonding process to provide a third transformed adhesive layer 159'. The sixth bonding terminals 156 and the fifth bonding terminals 147 may be bonded to each other by the second thermo-compression bonding process to provide a third bonded structure 158. Connection terminals 154 of the sixth bonding terminals 156 and the sixth bonding terminals 156 may be bonded to each other by fourth transformed solder bumps 155'. The third transformed adhesive layer 159' cured by the second thermo-compression bonding process may be disposed between the uppermost semiconductor die 150 and the upper semiconductor die 140.

For an embodiment indicated above, the thickness T1 of the uppermost semiconductor die 150 may be greater than the thickness T2 of the upper semiconductor die 140, and no through via providing a heat conduction path exists in the uppermost semiconductor die 150. Thus, even though the second thermo-compression bonding process is performed, it may be difficult for most of the heat generated by the second thermo-compression bonding process to conduct to the lower semiconductor dies 120 and 130 and the base substrate 110 through the uppermost semiconductor die 150. For this reason, the first thermo-compression bonding process may be performed before the second thermo-compression bonding process to initially bond the upper semiconductor die 140, the lower semiconductor dies 120 and 130, and the base substrate 110 to each other.

Figure 6:
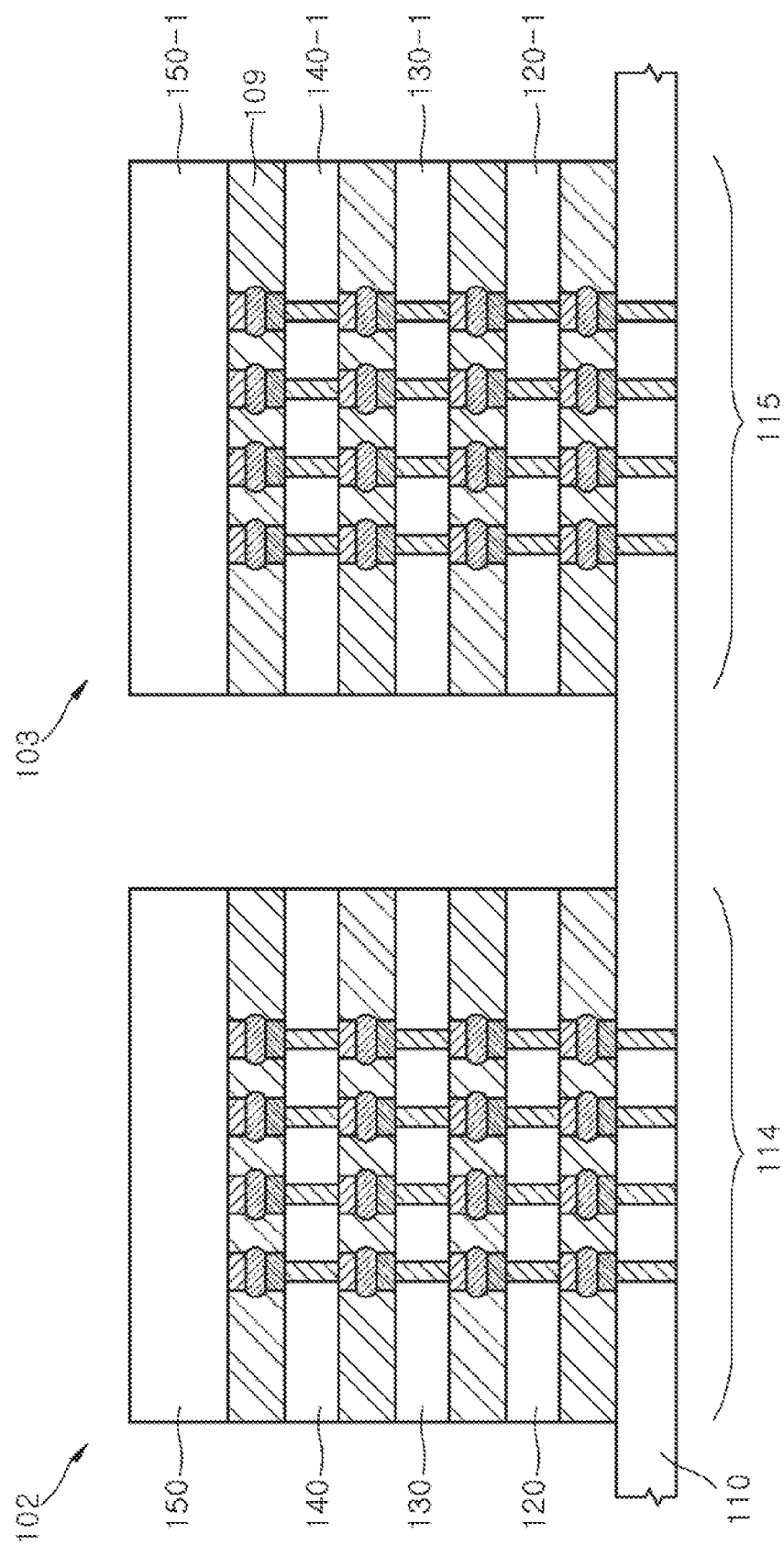

Referring to FIG. 6, after the lower semiconductor dies 120 and 130, the upper semiconductor die 140, and the uppermost semiconductor die 150 are sequentially stacked on the first region 114 of the base substrate 110 and are bonded to each other to form a first stack 102, a second stack 103 may be formed on the second region 115 of the base substrate 110. The second stack 103 may be formed using substantially the same method as used in forming the first stack 102. Specifically, a first lower semiconductor die 120-1 and a second lower semiconductor die 130-1 may be sequentially stacked on the second region 115 of the base substrate 110. An upper semiconductor die 140-1 may then be put on the second lower semiconductor die 130-1, and the first thermo-compression bonding process used in forming the first stack 102 may be applied to the upper semiconductor die 140-1. Thereafter, an uppermost semiconductor die 150-1 may be bonded to the upper semiconductor die 140-1 with the second thermo-compression bonding process used in the formation of the first stack 102. As a result, the second stack 103 including the lower semiconductor dies 120-1 and 130-1, the upper semiconductor die 140-1, and the uppermost semiconductor die 150-1 may be formed on the second region 115 of the base substrate 110.

After the first stack 102 is formed, the second stack 103 may be formed. That is, the first and second stacks 102 and 103 may be formed using two separate process operations. Thus, it may be possible to suppress a process operation for forming the first stack 102 or a process operation for forming the second stack 103 when the two process operations may affect one other if performed simultaneously. As a result, a process operation for forming the first stack 102 would not contribute to the occurrence of process failures during a process operation for forming the second stack 103. For example, it may be possible to prevent adhesive layers 109 in the second stack 103 from being prematurely cured by the thermo-compression bonding processes used in formation of the first stack 102.

FIGS. 1 to 6 illustrate an example in which four semiconductor dies are stacked on each of two regions 114 and 115 of the base substrate 110. A method of stacking a plurality of more than four semiconductor dies is described with reference to FIGS. 7 to 12.

FIGS. 7 to 12 show cross-sectional views illustrating a method of stacking semiconductor dies according to another embodiment.

Figure 7:
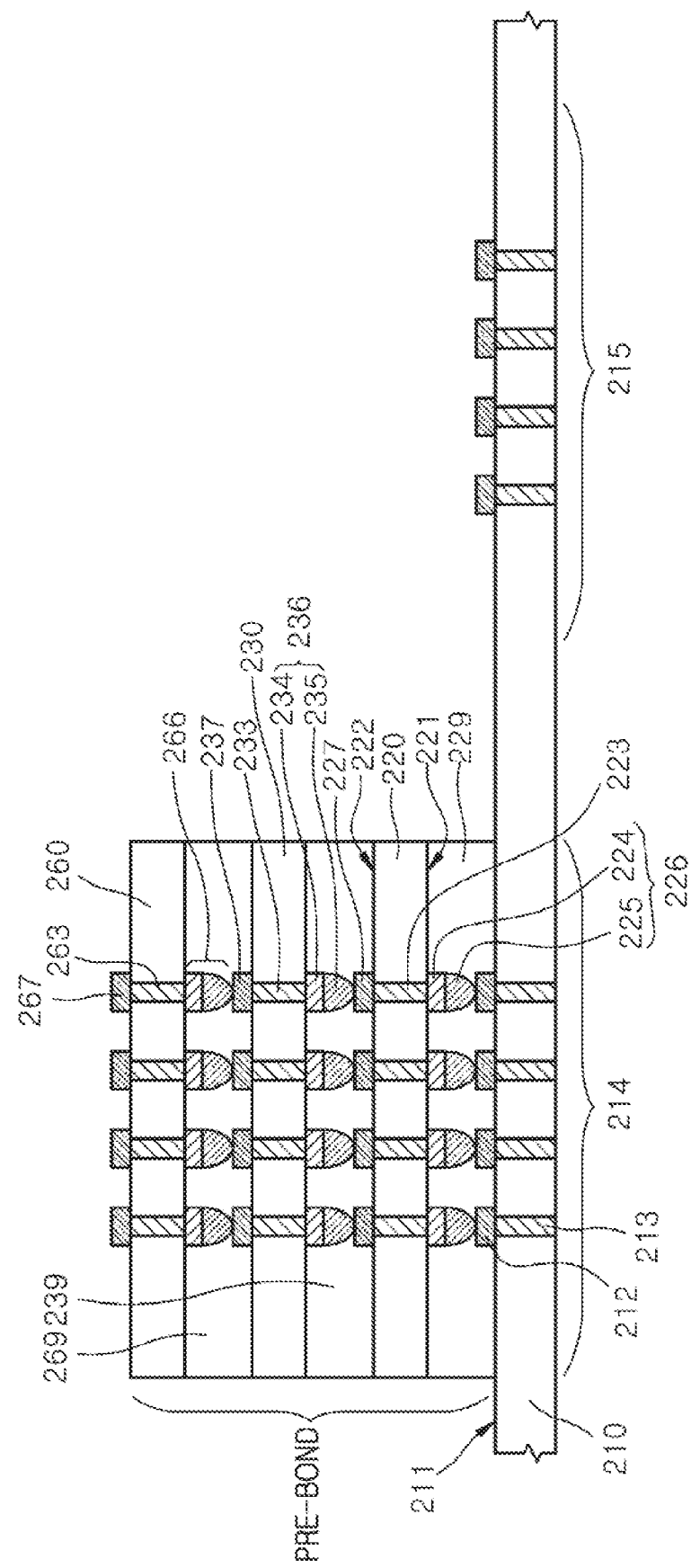
FIGS. 7 to 12 show cross-sectional views illustrating a method of stacking semiconductor dies, according to another embodiment.

Referring to FIG. 7, first to third lower semiconductor dies 220, 230, and 260 may be sequentially attached to a first region 214 of a base substrate 210 using a die attachment technique. At this stage, no semiconductor die is attached to a second region 215 of the base substrate 210. The base substrate 210 may include first bonding terminals 212 disposed on a surface 211 of the base substrate 210. The base substrate 210 may further include fifth through vias 213 electrically connected to the first bonding terminals 212.

The first lower semiconductor die 220 may have a first surface 221 facing the surface 211 of the base substrate 210 and a second surface 222 located opposite to the base substrate 210. The first lower semiconductor die 220 may include first through vias 223. The first through vias 223 may be through silicon vias (TSVs) extending from the first surface 221 of the first lower semiconductor die 220 to the second surface 222 of the first lower semiconductor die 220. Second bonding terminals 226 may be respectively connected to first ends of the first through vias 223, and third bonding terminals 227 may be respectively connected to second ends of the first through vias 223. Each of the second bonding terminals 226 may include a first connection bump 224 and a first solder bump 225 which are connected to any one of the first through vias 223.

A first adhesive layer 229 may be disposed on the first surface 221 of the first lower semiconductor die 220. The first adhesive layer 229 may include a nonconductive film (NCF). The first adhesive layer 229 may exist between the first lower semiconductor die 220 and the base substrate 210 in a non-cured state. In such a case, the second bonding terminals 226 of the first lower semiconductor die 220 may be in unsecured physical contact with the first bonding terminals 212 of the base substrate 210, respectively. That is, the first lower semiconductor die 220 may be attached to the base substrate 210 in a pre-bonded state.

The second lower semiconductor die 230 may include sixth through vias 233 penetrating the second lower semiconductor die 230. The second lower semiconductor die 230 may include eleventh bonding terminals 236, connected to first ends of the sixth through vias 233, and twelfth bonding terminals 237, connected to second ends of the sixth through vias 233. Each of the eleventh bonding terminals 236 may include a second connection bump 234 and a second solder bump 235. A sixth adhesive layer 239 may exist between the first lower semiconductor die 220 and the second lower semiconductor die 230 in a non-cured state.

The third lower semiconductor die 260 may be substantially the same as the first lower semiconductor die 220 and/or the second lower semiconductor die 230. The third lower semiconductor die 260 may include seventh through vias 263. The third lower semiconductor die 260 may further include thirteenth bonding terminals 266, connected to first ends of the seventh through vias 263, and fourteenth bonding terminals 267, connected to second ends of the seventh through vias 263. A seventh adhesive layer 269 may exist between the second lower semiconductor die 230 and the third lower semiconductor die 260 in a non-cured state.

Figure 8:
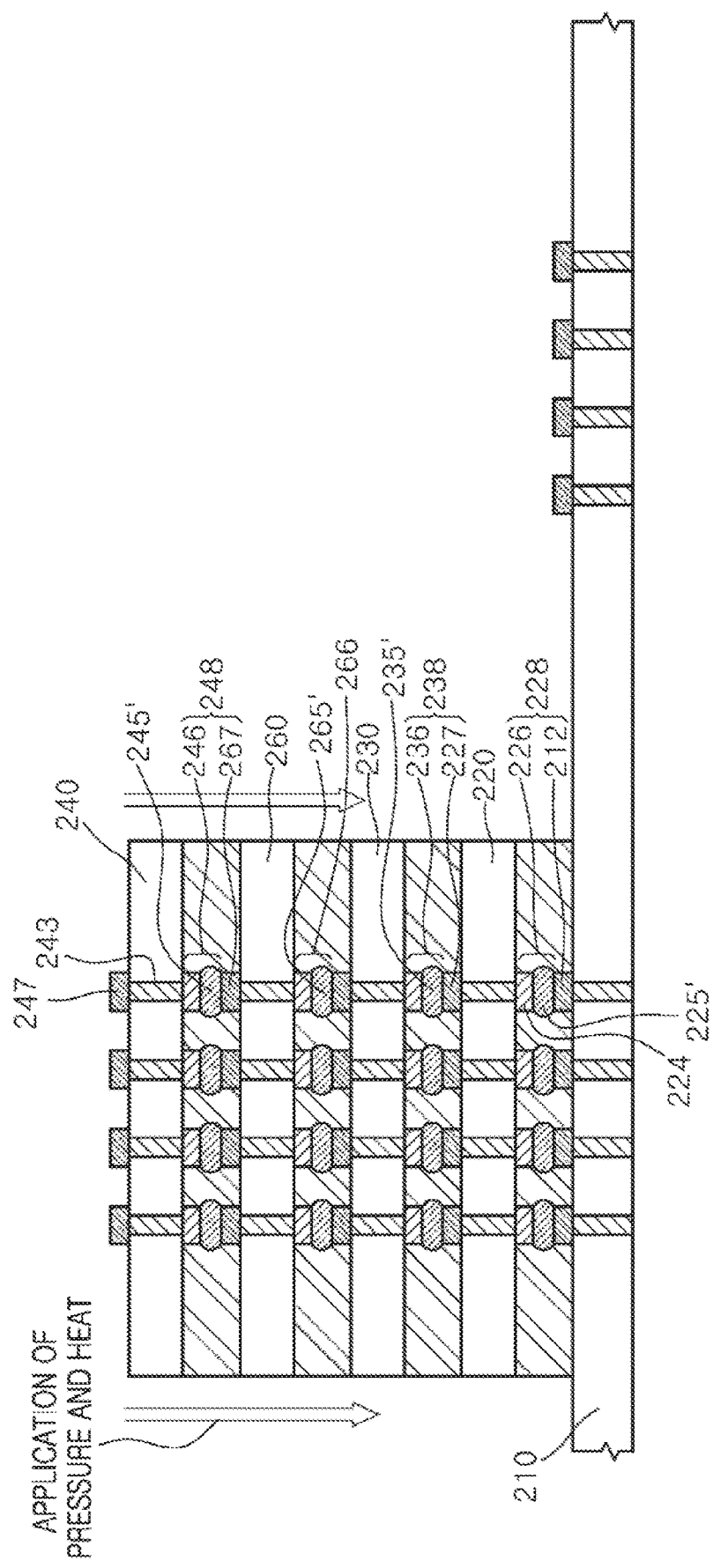

Referring to FIG. 8, a first upper semiconductor die 240 may be provided on the lower semiconductor dies 220, 230, and 260. The first upper semiconductor die 240 may include second through vias 243. The first upper semiconductor die 240 may further include fourth bonding terminals 246 connected to first ends of the second through vias 243 and fifth bonding terminals 247 connected to second ends of the second through vias 243.

The first upper semiconductor die 240 may be put on and aligned with the third lower semiconductor die 260. The first thermo-compression bonding process described with reference to FIGS. 1 to 6 may be applied to the first upper semiconductor die 240. In such a case, heat and pressure applied to the first upper semiconductor die 240 may be conducted to the third, second, and first lower semiconductor dies 260, 230, and 220, which are located below the first upper semiconductor die 240.

The heat applied to the first upper semiconductor die 240 may be conducted to the third bonding terminals 227 of the first lower semiconductor die 220 through the fifth bonding terminals 247, the second through vias 243 and the fourth bonding terminals 246 of the first upper semiconductor die 240. The heat conducted to the first lower semiconductor die 220 may be conducted to the first bonding terminals 212 of the base substrate 210 through the third bonding terminals 227, the first through vias 223, and the second bonding terminals 226 of the first lower semiconductor die 220.

The second bonding terminals 226 and the first bonding terminals 212 may be bonded to each other by the first thermo-compression bonding process to provide a first bonded structure 228. The eleventh bonding terminals 236 and the third bonding terminals 227 may be bonded to each other by the first thermo-compression bonding process to provide a second bonded structure 238. The fourth bonding terminals 246 and the fourteenth bonding terminals 267 may be bonded to each other by the first thermo-compression bonding process to provide a fifth bonded structure 248. The first solder bumps (225 of FIG. 7) may be transformed due to the heat and pressure generated during the first thermo-compression bonding process to provide first transformed solder bumps 225'. The first transformed solder bumps 225' may bond the first connection bump 224 to the first bonding terminals 212 to form the first bonded structure 228. The second solder bumps (235 of FIG. 7) of the eleventh bonding terminals 236, solder bumps of the thirteenth bonding terminals 266, and solder bumps of the fourth bonding terminals 246 may also be transformed due to the heat and pressure generated during the first thermo-compression bonding process to provide transformed solder bumps 235', 265', and 245', respectively.

Four or more lower semiconductor dies may be stacked below the first upper semiconductor die 240. However, if the number of the lower semiconductor dies located below the first upper semiconductor die 240 excessively increases, the heat generated by the first thermo-compression bonding process may be insufficiently conducted to a lowermost semiconductor die, resulting in bonding failure between the lower semiconductor dies and the first upper semiconductor die 240. Thus, the number of the lower semiconductor dies stacked below the first upper semiconductor die 240 may be limited in some instances. For different embodiments, geometries and/or materials may vary to accommodate a larger number of dies. For example, through vias may be thicker and/or constructed from varyingly thermo-conductive materials to more efficiently conduct heat.

Figure 9:
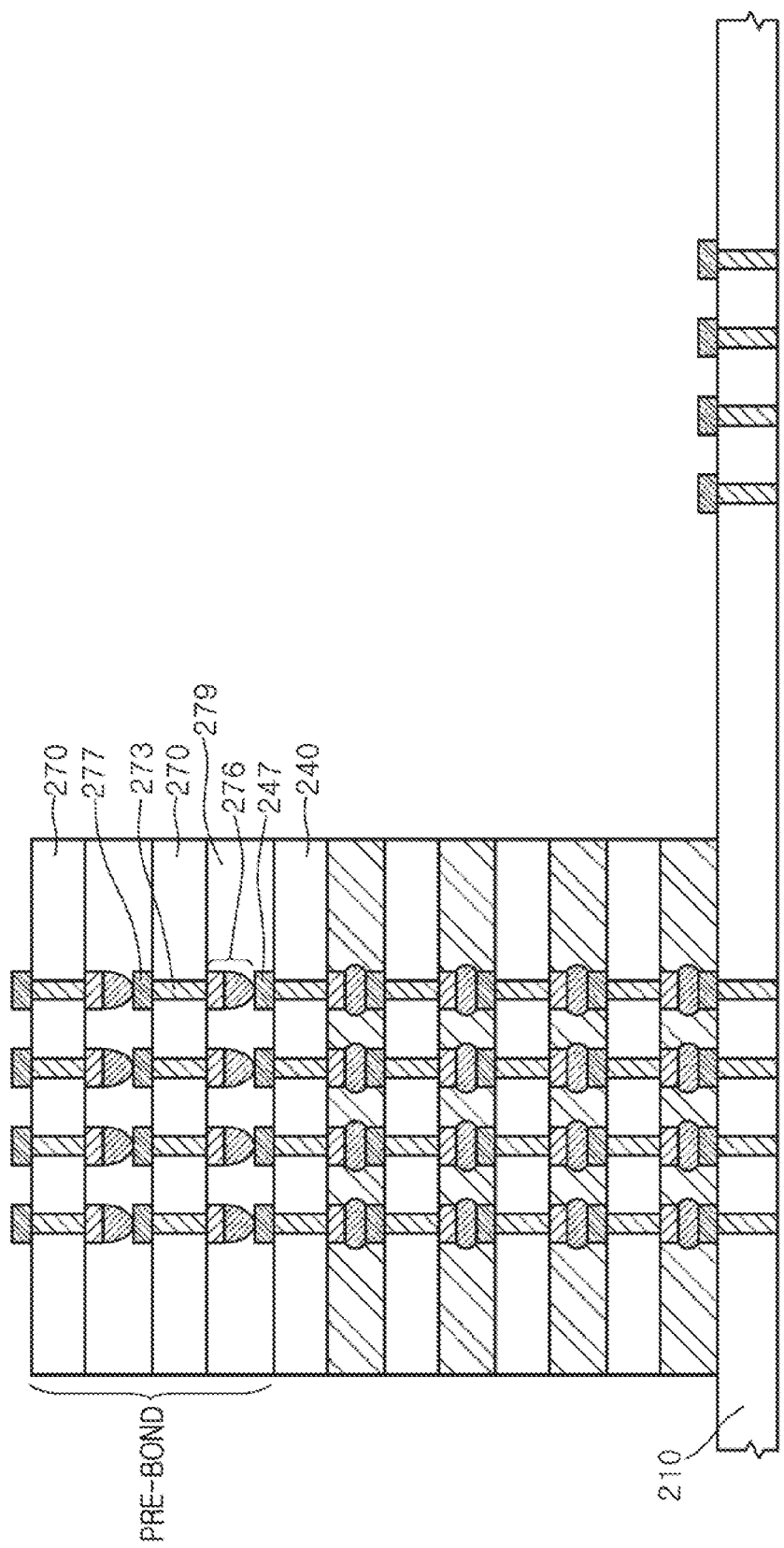

Referring to FIG. 9, one or more middle semiconductor dies 270 may be sequentially attached to the first upper semiconductor die 240. The middle semiconductor dies 270 may be picked up using a die attachment technique and may be put on and pre-bonded to the first upper semiconductor die 240. Each of the middle semiconductor dies 270 may include third through vias 273. Each of the middle semiconductor dies 270 may further include sixth bonding terminals 276 connected to first ends of the third through vias 273 and seventh bonding terminals 277 connected to second ends of the third through vias 273. A third adhesive layer 279 may be disposed between the middle semiconductor dies 270 and the first upper semiconductor die 240. The middle semiconductor dies 270 may be attached to the first upper semiconductor die 240 such that the sixth bonding terminals 276 are in contact with the fifth bonding terminals 247. The number of the middle semiconductor dies 270 may be two or three, for example, and the middle semiconductor dies 270 may be sequentially stacked on and attached to the first upper semiconductor die 240.

Figure 10:
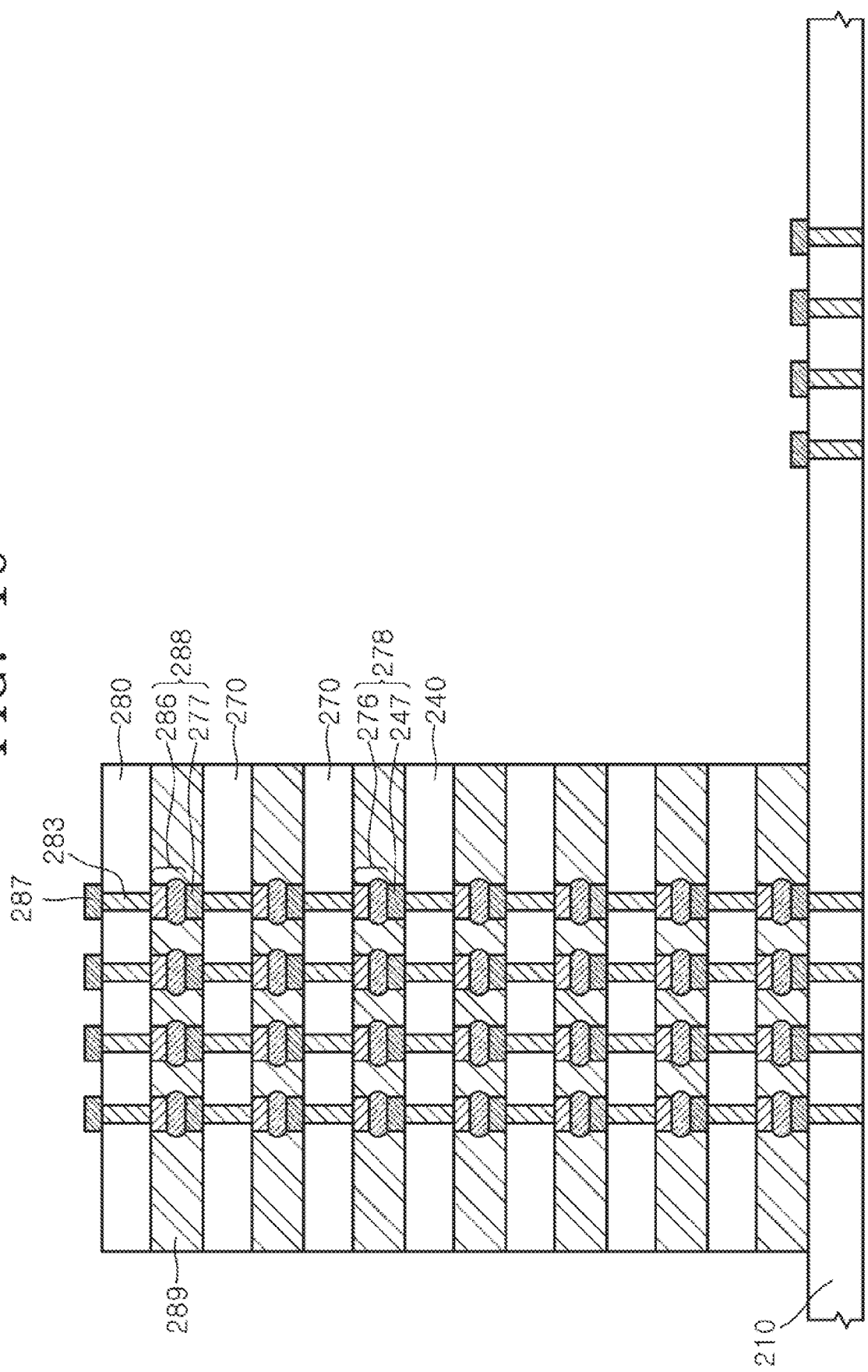

Referring to FIG. 10, a second upper semiconductor die 280 may be provided on the middle semiconductor dies 270. The second upper semiconductor die 280 may be substantially the same as the first upper semiconductor die 240. The second upper semiconductor die 280 may include fourth through vias 283. The second upper semiconductor die 280 may further include eighth bonding terminals 286 connected to first ends of the fourth through vias 283 and ninth terminals 287 connected to second ends of the fourth through vias 283.

The second upper semiconductor die 280 may be put on and aligned with the middle semiconductor dies 270, and the second thermo-compression bonding process described with reference to FIGS. 1 to 6 may be applied to the second upper semiconductor die 280. In such a case, heat and pressure applied to the second upper semiconductor die 280 may be conducted to the middle semiconductor dies 270, which are located below the second upper semiconductor die 280, through the fourth through vias 283. After the second thermo-compression bonding process, a cured adhesive layer 289 may be disposed between the second upper semiconductor die 280 and the middle semiconductor dies 270.

The eighth bonding terminals 286 and the seventh bonding terminals 277 may be bonded to each other by the second thermo-compression bonding process to provide a fourth bonded structure 288. The sixth bonding terminals 276 and the fifth bonding terminals 247 may also be bonded to each other by the second thermo-compression bonding process to provide a third bonded structure 278.

Three or more middle semiconductor dies 270 may be stacked below the second upper semiconductor die 280. However, if the number of the middle semiconductor dies located below the second upper semiconductor die 280 excessively increases, the heat generated by the second thermo-compression bonding process may be insufficiently conducted to a lowermost middle semiconductor die and cause bonding failure between the middle semiconductor dies and the second upper semiconductor die 280. Thus, the number of the middle semiconductor dies stacked below the second upper semiconductor die 280 may be limited for some instances. For different embodiments, geometries and/or materials may vary to accommodate a larger number of dies. For example, through vias may be thicker and/or constructed from varyingly thermo-conductive materials to more efficiently conduct heat.

Figure 11:
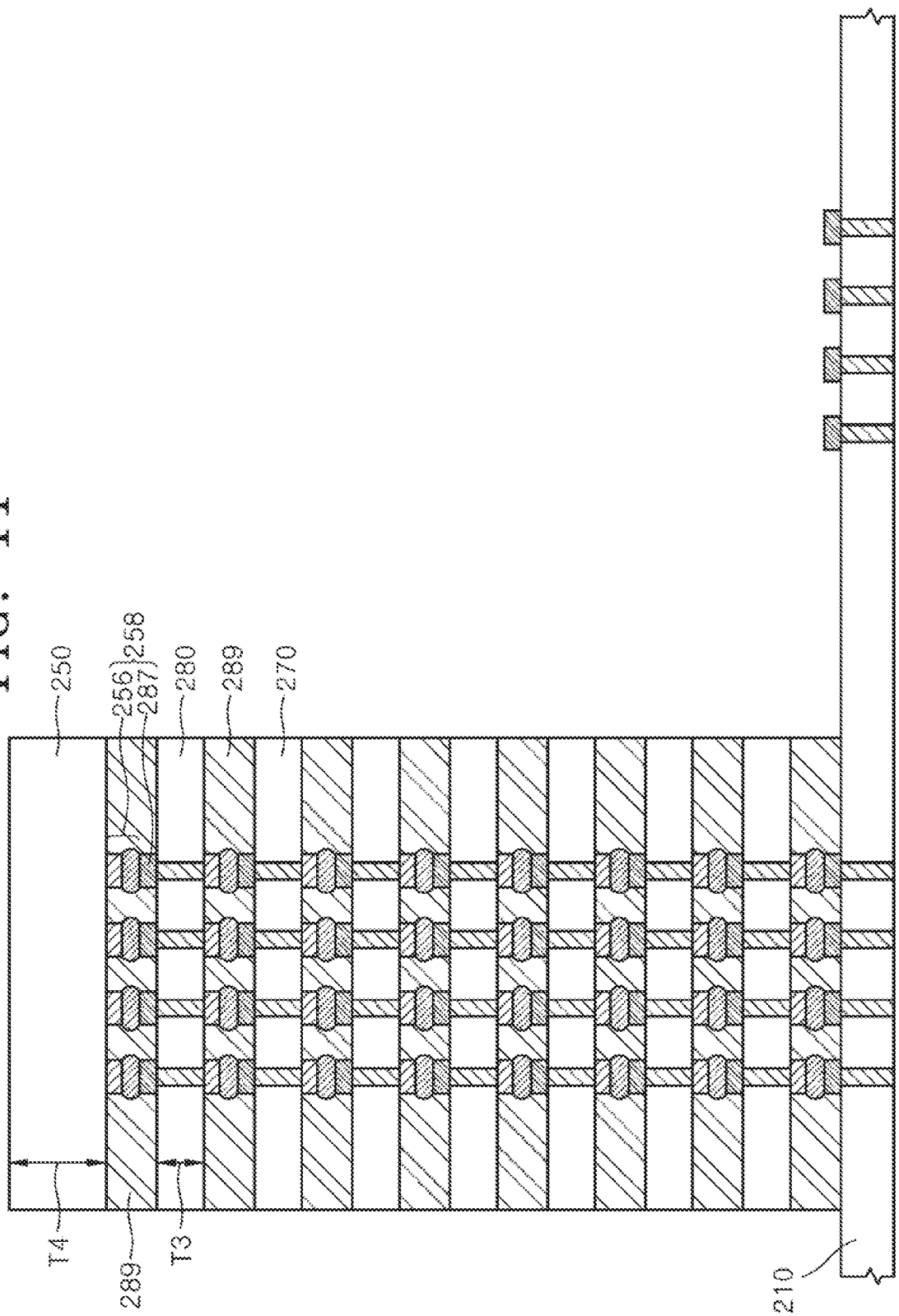

Referring to FIG. 11, an uppermost semiconductor die 250 may be bonded to the second upper semiconductor die 280 using the second thermo-compression bonding process. The uppermost semiconductor die 250 may have tenth bonding terminals 256 facing the ninth bonding terminals 287 of the second upper semiconductor die 280. The uppermost semiconductor die 250 may have a thickness T4. For some embodiments, the thickness T4 is greater than a thickness T3 of the second upper semiconductor die 280. In further embodiments, no through vias are included in the uppermost semiconductor die 250.

The uppermost semiconductor die 250 may be stacked on the second upper semiconductor die 280 such that a fifth adhesive layer is disposed between the uppermost semiconductor die 250 and the second upper semiconductor die 280. After the uppermost semiconductor die 250 is stacked on the second upper semiconductor die 280, a third second thermo-compression bonding process may be performed to cure the fifth adhesive layer. The fifth adhesive layer may be transformed by the third thermo-compression bonding process to provide a fifth cured adhesive layer 289. The tenth bonding terminals 256 and the ninth bonding terminals 287 may be bonded to each other by the third thermo-compression bonding process to provide a fifth bonded structure 258.

For an embodiment indicated above, the thickness T4 of the uppermost semiconductor die 250 may be greater than the thickness T3 of the second upper semiconductor die 280, and no through via providing a heat conduction path exists in the uppermost semiconductor die 250. Thus, even though the third thermo-compression bonding process is performed, it may be difficult for most of the heat generated by the third thermo-compression bonding process to conduct to the middle semiconductor dies 270 through the uppermost semiconductor die 250. For this reason, the second thermo-compression bonding process may be performed before the third thermo-compression bonding process to initially bond the second upper semiconductor die 280 and the middle semiconductor dies 270 to each other.

Figure 12:
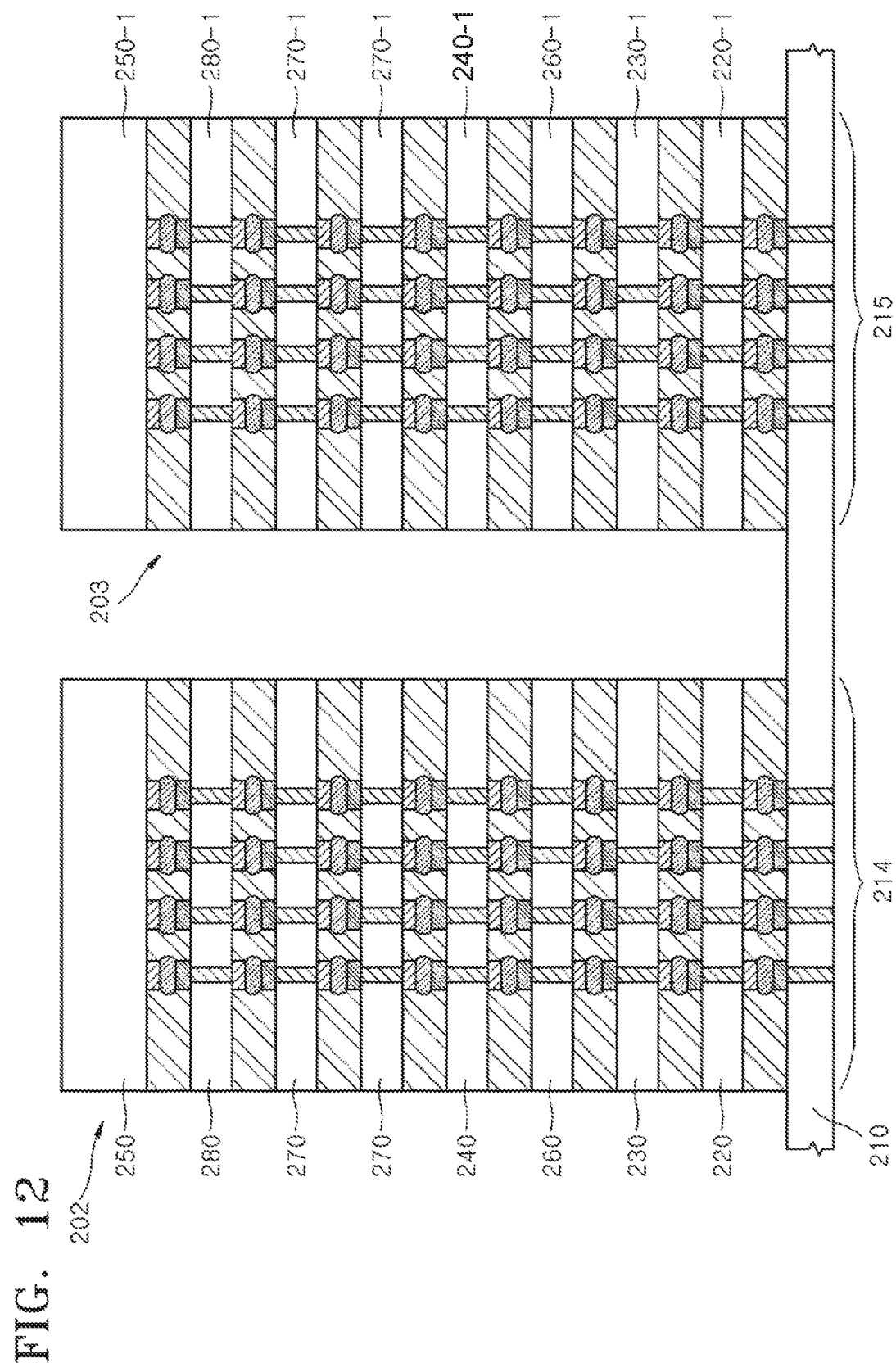

Referring to FIG. 12, after the lower semiconductor dies 220, 230, and 260, the first upper semiconductor die 240, the middle semiconductor dies 270, the second upper semiconductor die 280, and the uppermost semiconductor die 250 are sequentially stacked on the first region 214 of the base substrate 210 and are bonded to each other to form a first stack 202, a second stack 203 may be formed on the second region 215 of the base substrate 210. The second stack 203 may be formed using substantially the same method as used in forming of the first stack 202. That is, lower semiconductor dies 220-1, 230-1 and 260-1, a first upper semiconductor die 240-1, middle semiconductor dies 270-1, a second upper semiconductor die 280-1, and an uppermost semiconductor die 250-1 may be sequentially attached and bonded to the second region 215 of the base substrate 210.

Referring again to FIG. 1, while the first lower semiconductor die 120 is attached to the base substrate 110, the first adhesive layer 129 may fix the first lower semiconductor die 120 to the base substrate 110 to keep the first lower semiconductor die 120 and the base substrate 110 aligned. Thus, when the first bonded structure 128 is formed by the first thermo-compression bonding process, an alignment status between the first connection bumps 124 and the first bonding terminals 112 may be maintained. Accordingly, misalignment between the first connection bumps 124 and the first bonding terminals 112 may be mitigated or avoided.

While the first lower semiconductor die 120 is attached to the base substrate 110, the first adhesive layer 129 may be disposed between the first lower semiconductor die 120 and the base substrate 110. Thus, it may be unnecessary to perform a process for filling a space between the first lower semiconductor die 120 and the base substrate 110 with an underfill layer after the first lower semiconductor die 120 is bonded to the base substrate 110 using a thermo-compression bonding process. Accordingly, a process failure due to the underfill process may be precluded. After the lower semiconductor dies 120 and 130 are attached to the base substrate 110, the lower semiconductor dies 120 and 130 and the upper semiconductor die 140 may be bonded to each other at the same time using a thermo-compression bonding technique. As a result, a process time it takes to form a stack structure including the lower semiconductor dies 120 and 130 and the upper semiconductor die 140 may be reduced.

Figure 13:
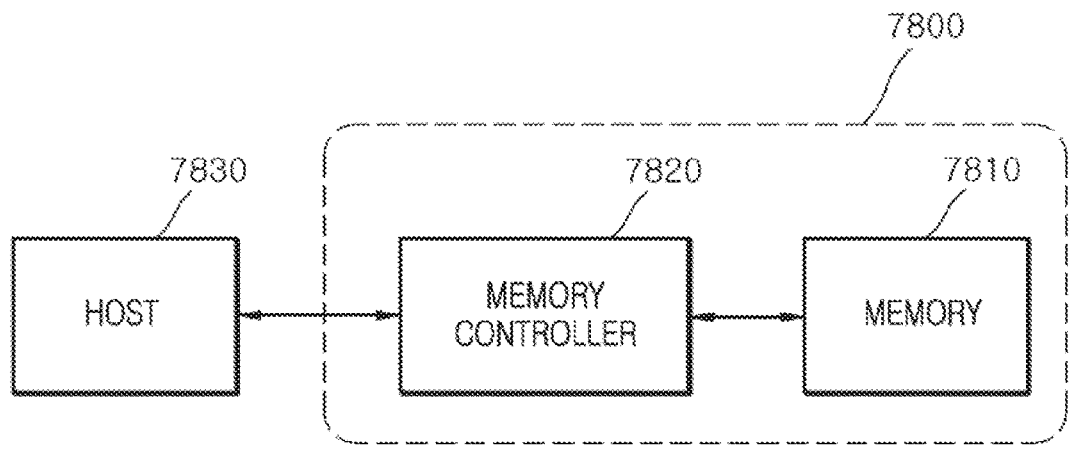
FIG. 13 shows a block diagram illustrating an electronic system employing a memory card including at least one semiconductor package fabricated according to various embodiments.

FIG. 13 shows a block diagram illustrating an electronic system including a memory card 7800 employing at least one of the stack packages fabricated according to described embodiments. The memory card 7800 includes a memory 7810, such as a nonvolatile memory device, and a memory controller 7820. The memory 7810 and the memory controller 7820 may store data and read out the stored data. At least one of the memory 7810 and the memory controller 7820 may include at least one of the packages fabricated according to described embodiments.

The memory 7810 may include a nonvolatile memory device to which the technology of described embodiments of the present disclosure is applied. The memory controller 7820 may control the memory 7810 such that stored data is read out or data is stored in response to a read/write request from a host 7830.

Figure 14:
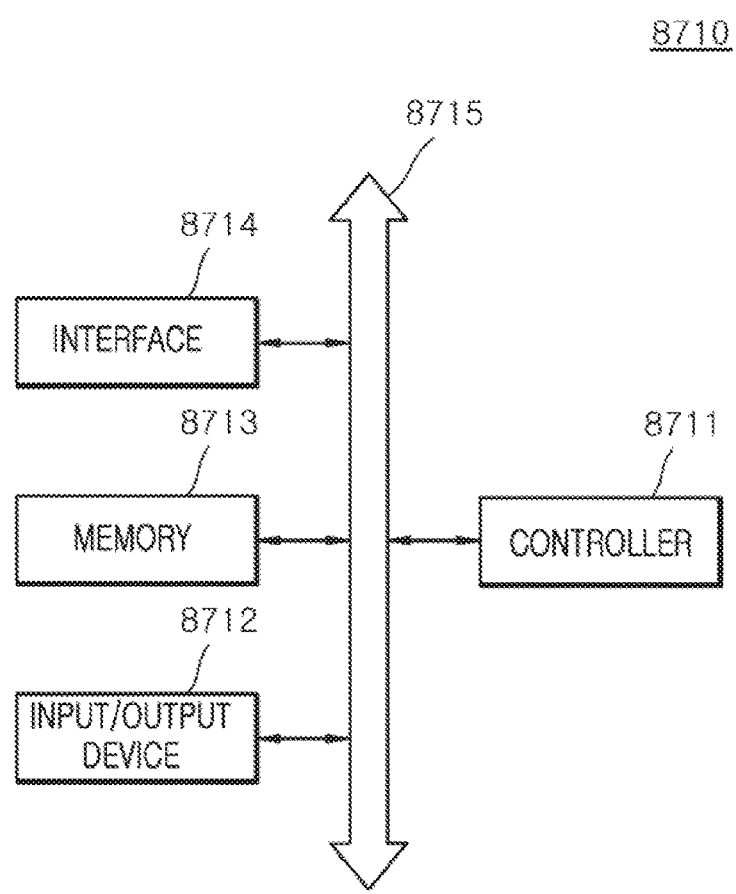
FIG. 14 shows a block diagram illustrating another electronic system including at least one semiconductor package fabricated according to various embodiments.

FIG. 14 shows a block diagram illustrating an electronic system 8710 including at least one of the stack packages fabricated according to described embodiments. The electronic system 8710 may include a controller 8711, an input/output device 8712, and a memory 8713. The controller 8711, the input/output device 8712, and the memory 8713 may be coupled with one another through a bus 8715 providing a path through which data can flow.

In an embodiment, the controller 8711 may include one or more of a microprocessor, a digital signal processor, a microcontroller, and/or a logic device capable of performing the same functions as these components. The controller 8711 or the memory 8713 may include one or more of the stack packages fabricated according to described embodiments of the present disclosure. The input/output device 8712 may include at least one component selected among a keypad, a keyboard, a display device, a touchscreen, and so forth. The memory 8713 is a device for storing data. The memory 8713 may store data and/or commands to be executed by the controller 8711, and the like.

The memory 8713 may include a volatile memory device, such as a DRAM, and/or a nonvolatile memory device, such as a flash memory. For example, a flash memory may be mounted to an information processing system, such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer, or a logic system performing various functions. For example, the mobile system may be any one of a personal digital assistant (PDA), a portable computer, a tablet computer, a mobile phone, a smart phone, a wireless phone, a laptop computer, a memory card, a digital music system, and an information transmission/reception system.

If the electronic system 8710 is equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDAM (wideband code division multiple access), CDMA2000, LTE (long term evolution), or Wibro (wireless broadband Internet).

Embodiments of the present disclosure have been disclosed for illustrative purposes. Those skilled in the art will appreciate that various modifications, additions, and substitutions are possible, without departing from the scope and spirit of the present disclosure and the accompanying claims.

What is claimed is:

1. A method of stacking semiconductor dies, the method comprising:
providing a base substrate comprising a first bonding terminal disposed on a surface of the base substrate;

providing a first lower semiconductor die comprising a second bonding terminal, a first through via, and a third bonding terminal;

providing an upper semiconductor die comprising a fourth bonding terminal, a second through via, and a fifth bonding terminal;

aligning the first lower semiconductor die with the base substrate such that the second bonding terminal is in contact with the first bonding terminal;

providing a first adhesive layer between the first lower semiconductor die and the base substrate;

aligning the upper semiconductor die with the first lower semiconductor die such that the fourth bonding terminal is in contact with the third bonding terminal;

providing a second adhesive layer between the upper semiconductor die and the first lower semiconductor die; and performing a first thermo-compression bonding process to:
cure the first and second adhesive layers;
form a first bonded structure from the first and second bonding terminals; and
form a second bonded structure from the third and fourth bonding terminals.

2. The method of claim 1,
wherein the second bonding terminal comprises a second connection bump connected to the first through via and a second solder bump covering the second connection bump; and
wherein the first thermo-compression bonding process transforms the second solder bump to form the first bonded structure by bonding the second connection bump to the first bonding terminal.

3. The method of claim 2, wherein the first thermo-compression bonding process is performed at a temperature which is higher than a curing temperature of the first adhesive layer.

4. The method of claim 2, wherein heat generated by the first thermo-compression bonding process is conducted to the second solder bump through the fifth bonding terminal, the second through via, the fourth bonding terminal, the third bonding terminal, the first through via, and the second connection bump.

5. The method of claim 1, further comprising:
providing an uppermost semiconductor die comprising a sixth bonding terminal and having a thickness greater than a thickness of the upper semiconductor die;
aligning the uppermost semiconductor die with the upper semiconductor die such that the sixth bonding terminal is in contact with the fifth bonding terminal;
providing a third adhesive layer between the uppermost semiconductor die and the upper semiconductor die; and
performing a second thermo-compression bonding process to:
cure the third adhesive layer; and
form a third bonded structure from the fifth and sixth bonding terminals.

6. The method of claim 1, further comprising:
providing a second lower semiconductor die between the first lower semiconductor die and the upper semiconductor die; and
aligning the second lower semiconductor die such that the fourth bonding terminal is in contact with the third bonding terminal through a through via of the second lower semiconductor die.

7. The method of claim 1, wherein a first stack comprising the first lower semiconductor die and the upper semiconductor die is formed by the first thermo-compression bonding process, the method further comprising:
attaching an additional lower semiconductor die to a region of the base substrate spaced apart from the first stack; and
bonding an additional upper semiconductor die to the additional lower semiconductor die using thermo-compression to form a second stack comprising the additional lower semiconductor die and the additional upper semiconductor die.

8. The method of claim 1, wherein the first adhesive layer comprises a non-conductive film (NCF).

9. The method of claim 1,
wherein the first lower semiconductor die has a first surface facing the base substrate;
wherein the second bonding terminals are disposed on the first surface of the first lower semiconductor die;
wherein the third bonding terminals are disposed on a second surface of the first lower semiconductor die opposite the base substrate;
wherein the first through via penetrates the first lower semiconductor die; and
wherein the second bonding terminal is connected to a first end of the first through via, and the third bonding terminal is connected to a second end of the first through via.

10. The method of claim 1,
wherein the base substrate comprises a third through via extending into the base substrate and connected to the first bonding terminal.

11. A method of stacking semiconductor dies, the method comprising:
providing a base substrate comprising a first bonding terminal disposed on a surface of the base substrate;
providing a first lower semiconductor die comprising a second bonding terminal, a first through via, and a third bonding terminal;
providing a first upper semiconductor die comprising a fourth bonding terminal, a second through via, and a fifth bonding terminal;
providing a middle semiconductor die comprising a sixth bonding terminal, a third through via, and a seventh bonding terminal;
providing a second upper semiconductor die comprising an eighth bonding terminal, a fourth through via, and a ninth bonding terminal;
aligning the first lower semiconductor die with the base substrate such that the second bonding terminal is in contact with the first bonding terminal;
providing a first adhesive layer between the first lower semiconductor die and the base substrate;
aligning the first upper semiconductor die with the first lower semiconductor die such that the fourth bonding terminal is in contact with the third bonding terminal;
providing a second adhesive layer between the first upper semiconductor die and the first lower semiconductor die;
performing a first thermo-compression bonding process to:
cure the first and second adhesive layers;
form a first bonded structure from the first and second bonding terminals; and
form a second bonded structure from the third and fourth bonding terminals;

aligning the middle semiconductor die with the first upper semiconductor die such that the sixth bonding terminal is in contact with the fifth bonding terminal;
providing a third adhesive layer between the middle semiconductor die and the first upper semiconductor die;
aligning the second upper semiconductor die with the middle semiconductor die such that the eighth bonding terminal is in contact with the seventh bonding terminal;
providing a fourth adhesive layer between the second upper semiconductor die and the middle semiconductor die; and
performing a second thermo-compression bonding process to:
cure the third and fourth adhesive layers;
form a third bonded structure from the fifth and sixth bonding terminals; and
form a fourth bonded structure from the seventh and eighth bonding terminals.

12. The method of claim 11,
wherein the second bonding terminal comprises a second connection bump connected to the first through via and a second solder bump covering the second connection bump; and
wherein the first thermo-compression bonding process transforms the second solder bump to form the first bonded structure by bonding the second connection bump to the first bonding terminal.

13. The method of claim 12, wherein the first thermo-compression bonding process is performed at a temperature which is higher than a curing temperature of the first adhesive layer.

14. The method of claim 12, wherein heat generated by the first thermo-compression bonding process is conducted to the second solder bump through the fifth bonding terminal, the second through via, the fourth bonding terminal, the third bonding terminal, the first through via, and the second connection bump.

15. The method of claim 11, further comprising:
providing an uppermost semiconductor die comprising a tenth bonding terminal and having a thickness greater than a thickness of the second upper semiconductor die;
aligning the uppermost semiconductor die with the second upper semiconductor die such that the tenth bonding terminal is in contact with ninth bonding terminal
providing a fifth adhesive layer between the uppermost semiconductor die and the second upper semiconductor die; and
performing a third thermo-compression bonding process to:
cure the fifth adhesive layer; and
form a fifth bonded structure from the ninth and tenth bonding terminals.

16. The method of claim 11, further comprising:
providing a second lower semiconductor die between the first lower semiconductor die and the first upper semiconductor die;
aligning the second lower semiconductor die such that the fourth bonding terminal is in contact with the third bonding terminal through a through via of the second lower semiconductor die;
providing another middle semiconductor die between the middle semiconductor die and the second upper semiconductor die;
aligning the another middle semiconductor die such that the eighth bonding terminal is in contact with the seventh bonding terminal through a through via of the another middle semiconductor die.

17. The method of claim 11, wherein a first stack comprising the first lower semiconductor die, the first upper semiconductor die, the middle semiconductor die, and the second upper semiconductor die is formed by the second thermo-compression bonding process, the method further comprising:
attaching an additional lower semiconductor die to a region of the base substrate spaced apart from the first stack; and
bonding an additional first upper semiconductor die to the additional lower semiconductor die using thermo-compression to form a second stack comprising the additional lower semiconductor die and the additional first upper semiconductor die.

18. A method of stacking semiconductor dies, the method comprising:
stacking at least one semiconductor die on a base substrate, wherein each of the at least one semiconductor dies comprises a first set of bonding terminals on a first side of the semiconductor die, a second set of bonding terminals on a second side of the semiconductor die, and a set of through vias penetrating the semiconductor die with each through via connecting a bonding terminal on the first side of the semiconductor die to a bonding terminal on the second side of the semiconductor die;
aligning the at least one stacked semiconductor die over the base substrate in a first-side-down orientation so that the first set of bonding terminals of a lowermost semiconductor die of the aligned stacked at least one semiconductor die connect with a set of bonding terminals on a surface of the base substrate; and
applying heat to the second set of bonding terminals of an uppermost semiconductor die of the aligned stacked at least one semiconductor die so that the applied heat is conducted through the sets of through vias of the aligned stacked at least one semiconductor die, wherein, as a result of the conducted heat, the first set of bonding terminals of the lowermost semiconductor die fuse with the set of bonding terminals of the base substrate to form a set of bonded structures between the lowermost semiconductor die and the base substrate.

19. The method of claim 18, further comprising placing an adhesive layer between the lowermost semiconductor die and the base substrate, wherein the conducted heat cures the adhesive layer.

20. The method of claim 19, further comprising placing at least one additional adhesive layer between adjacent semiconductor dies of the stacked at least one semiconductor die, wherein the conducted heat cures the at least one additional adhesive layer, and wherein, as a result of the conducted heat, the first set of bonding terminals and the second set of bonding terminals between the adjacent semiconductor dies fuse to form additional sets of bonded structures between the adjacent semiconductor dies.

* * * * *